(12) United States Patent
Kasahara

(10) Patent No.: US 10,586,758 B2
(45) Date of Patent: Mar. 10, 2020

(54) SUBSTRATE-WITH-SUPPORT

(71) Applicant: SHINKO ELECTRIC INDUSTRIES CO., LTD., Nagano (JP)

(72) Inventor: Tetsuichiro Kasahara, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 16/216,152

(22) Filed: Dec. 11, 2018

(65) Prior Publication Data
US 2019/0221505 A1 Jul. 18, 2019

(30) Foreign Application Priority Data

Jan. 12, 2018 (JP) ................. 2018-003323

(51) Int. Cl.
H05K 1/02 (2006.01)
H05K 1/11 (2006.01)
(Continued)

(52) U.S. Cl.
CPC ...... *H01L 23/49582* (2013.01); *H01L 21/565* (2013.01); *H01L 23/3128* (2013.01); *H01L 23/49586* (2013.01); *H01L 23/49822* (2013.01); *H01L 23/49827* (2013.01); *H01L 23/49894* (2013.01); *H01L 24/32* (2013.01); *H01L 24/49* (2013.01); *H01L 24/97* (2013.01); *H05K 1/028* (2013.01); *H05K 1/0271* (2013.01); *H05K 1/0298* (2013.01); *H01L 21/561* (2013.01); *H01L 23/49816* (2013.01); *H01L 24/16* (2013.01); *H01L 24/45* (2013.01);
(Continued)

(58) Field of Classification Search
CPC ......... H01L 23/49582; H01L 23/49586; H01L 24/49; H01L 24/32; H05K 1/0271; H05K 1/0278; H05K 1/0281; H05K 1/0284; H05K 1/0298; H05K 1/11; H05K 1/111; H05K 1/112; H05K 1/18; H05K 1/181; H05K 2201/04; H05K 2201/09054; H05K 2201/09136; H05K 2201/096; H05K 2201/10424; H05K 2201/10681; H05K 2201/2009; H05K 2201/2018
See application file for complete search history.

(56) References Cited

U.S. PATENT DOCUMENTS 8,024,857 B2 * 9/2011 Jung ................ H01L 23/13
174/255
8,426,739 B2 * 4/2013 Lee ................ H05K 1/0271
174/254
(Continued)

FOREIGN PATENT DOCUMENTS

JP 2007-165513 6/2007
JP 2010-050351 3/2010

*Primary Examiner* — Ishwarbhai B Patel
(74) *Attorney, Agent, or Firm* — IPUSA, PLLC

(57) ABSTRACT

A substrate-with-support includes: a substrate having a wiring area, an outer peripheral area provided on an outer peripheral side of the wiring area, and a plurality of support joint portions being provided on the outer peripheral area; and a support made of metal having an outer frame portion arranged to face the outer peripheral area and to expose the wiring area, and a plurality of protruding portions being provided on the outer frame portion, wherein the support joint portions and the protruding portions are joined to each other.

8 Claims, 10 Drawing Sheets

(51) Int. Cl.
*H05K 1/18* (2006.01)
*H01L 23/49* (2006.01)
*H01L 23/495* (2006.01)
*H01L 23/00* (2006.01)
*H01L 23/498* (2006.01)
*H01L 21/56* (2006.01)
*H01L 23/31* (2006.01)

(52) U.S. Cl.
CPC .............. *H01L 24/48* (2013.01); *H01L 24/81* (2013.01); *H01L 24/83* (2013.01); *H01L 24/85* (2013.01); *H01L 2224/45144* (2013.01); *H01L 2224/45147* (2013.01); *H01L 2224/48091* (2013.01); *H01L 2224/48227* (2013.01); *H01L 2224/48228* (2013.01); *H01L 2224/73265* (2013.01); *H01L 2224/83101* (2013.01); *H01L 2924/00014* (2013.01); *H01L 2924/15311* (2013.01); *H01L 2924/181* (2013.01); *H05K 1/11* (2013.01); *H05K 1/111* (2013.01); *H05K 1/18* (2013.01)

(56) References Cited

U.S. PATENT DOCUMENTS

2005/0012183 A1\* 1/2005 Chow ................. H01L 23/3107
 257/666
2006/0289971 A1\* 12/2006 Lange .................. H01L 21/565
 257/666

\* cited by examiner

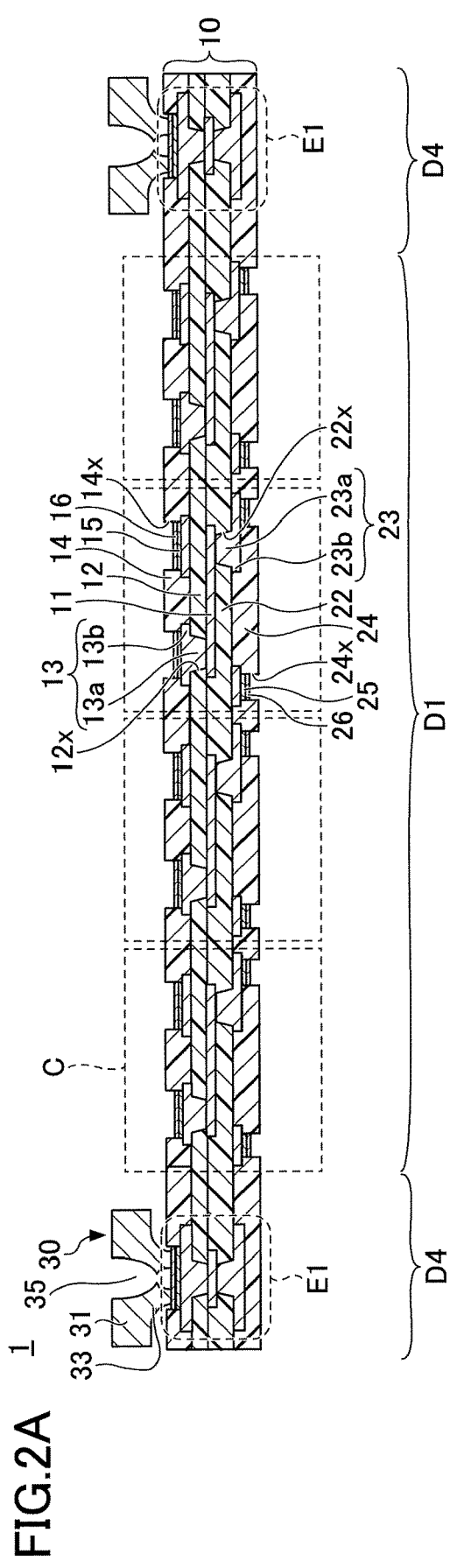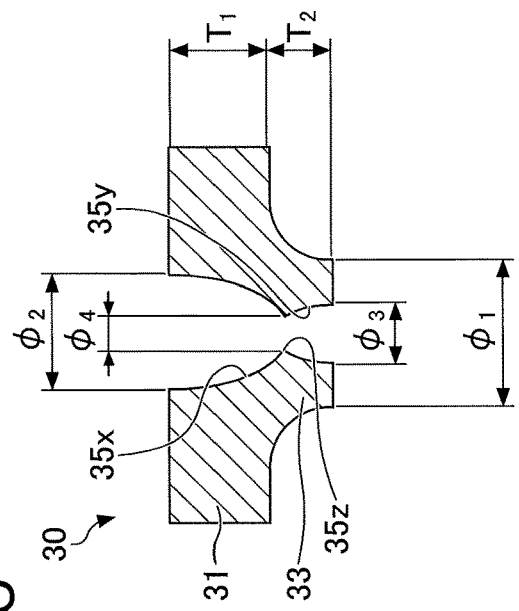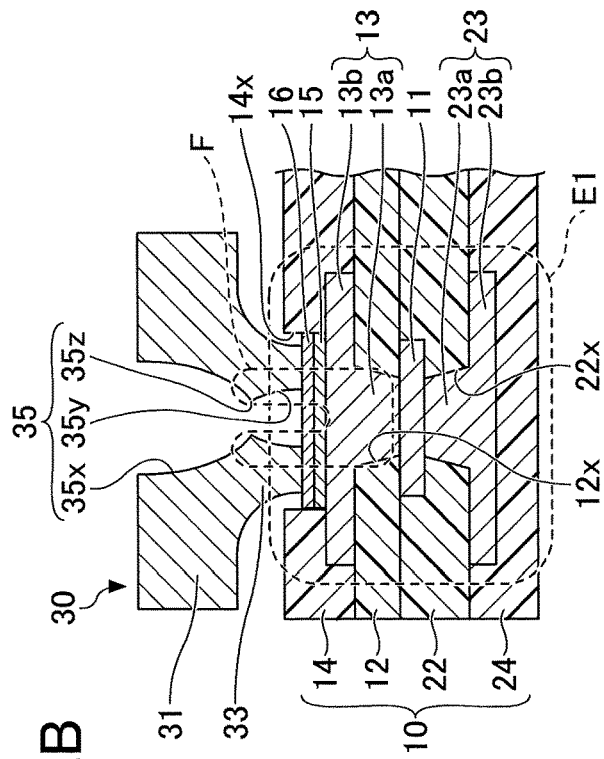

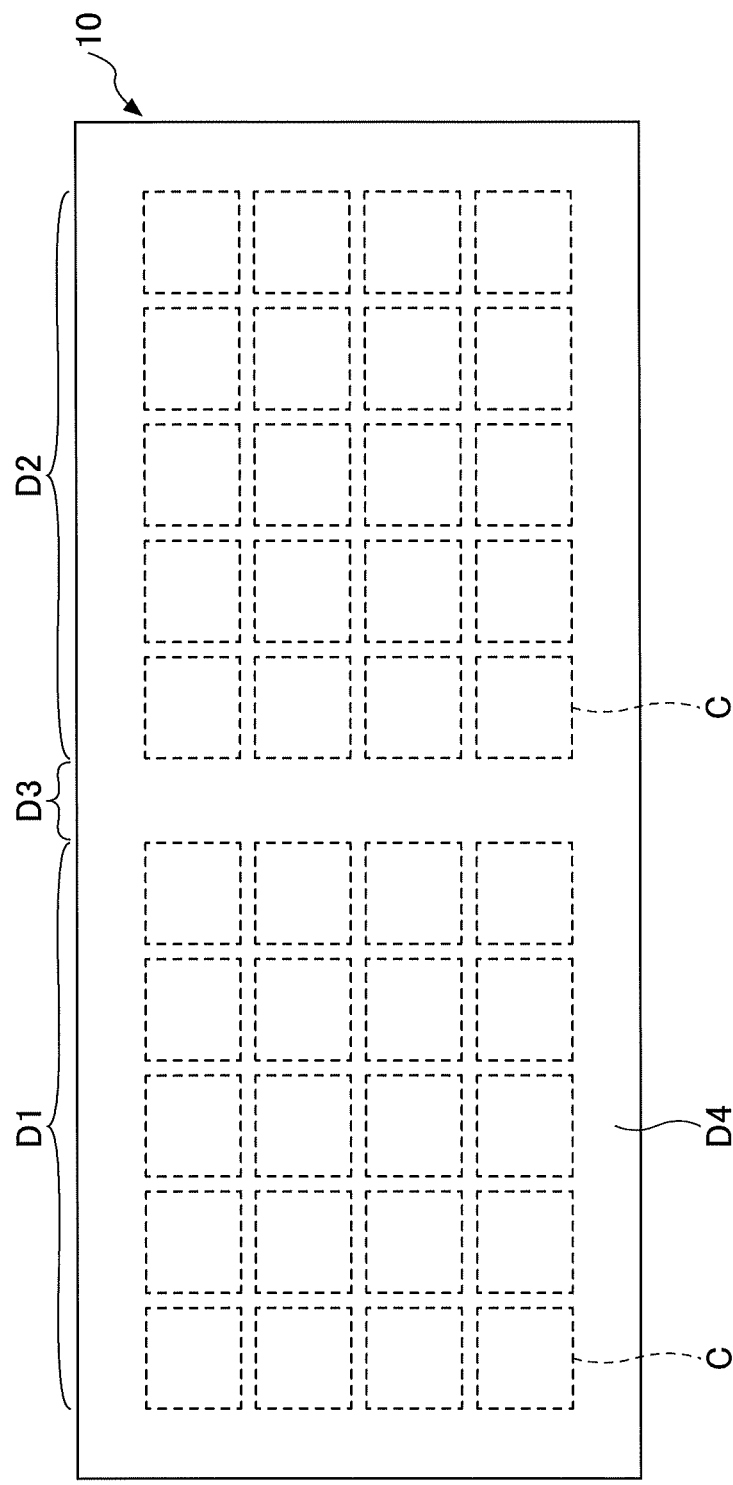

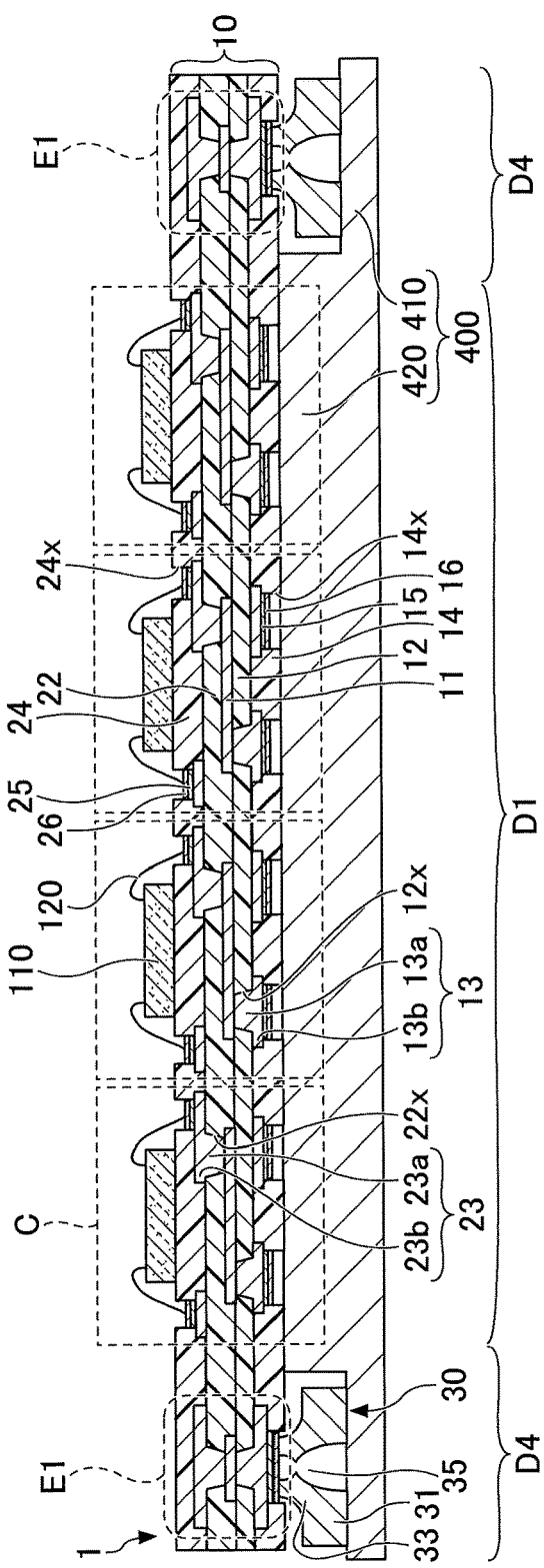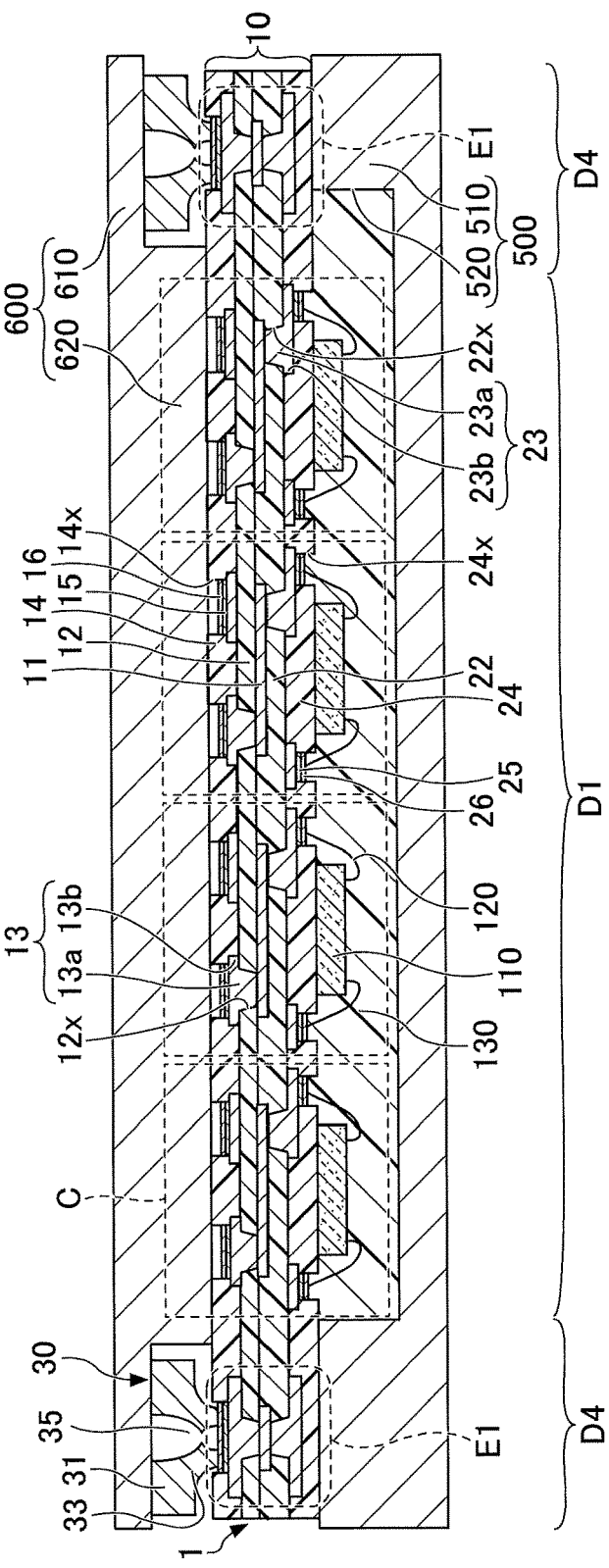

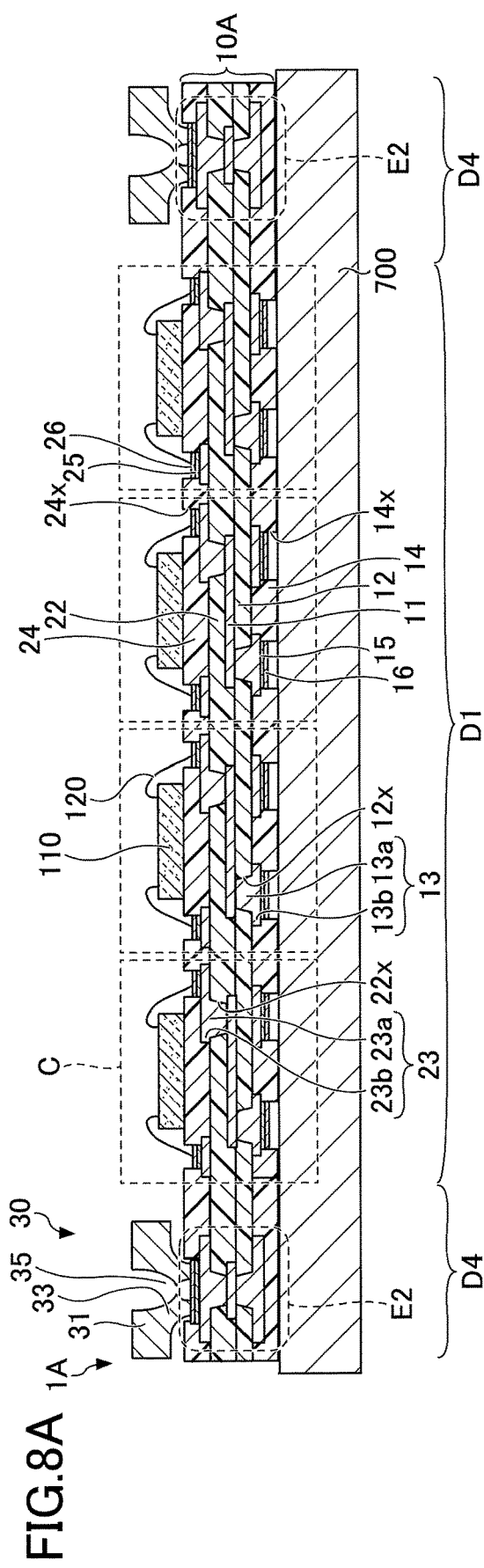
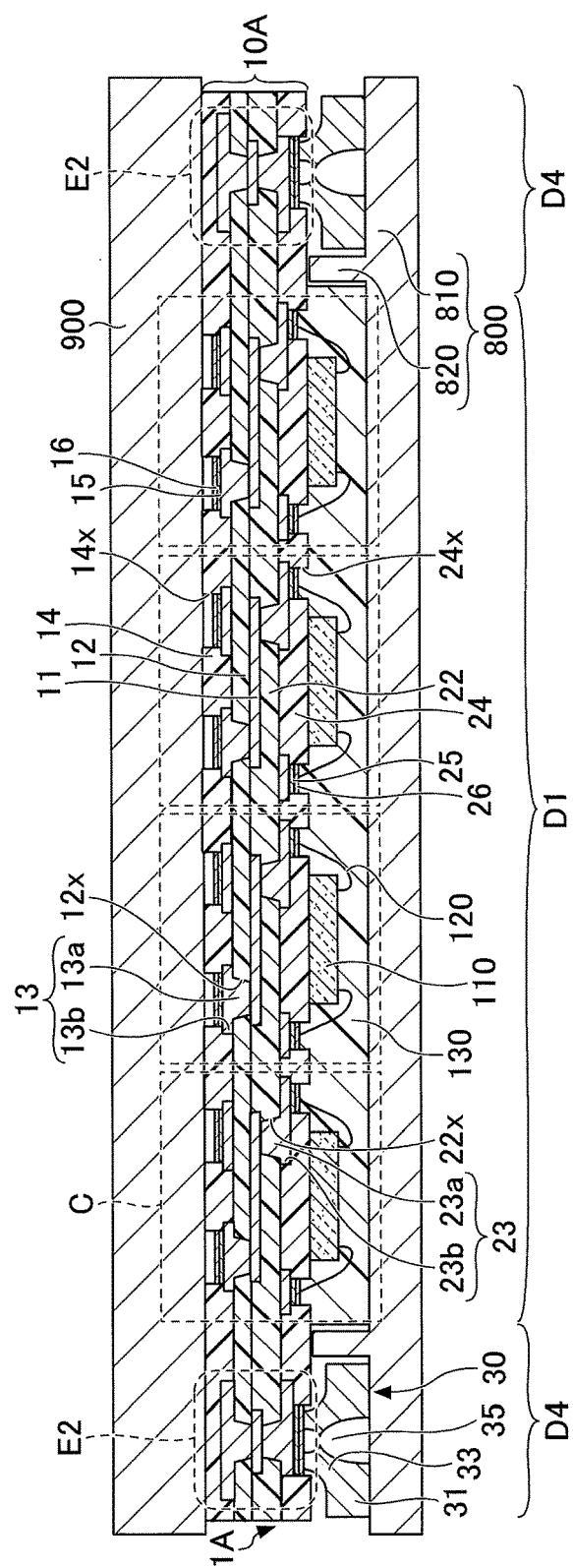
FIG.8A
FIG.8B

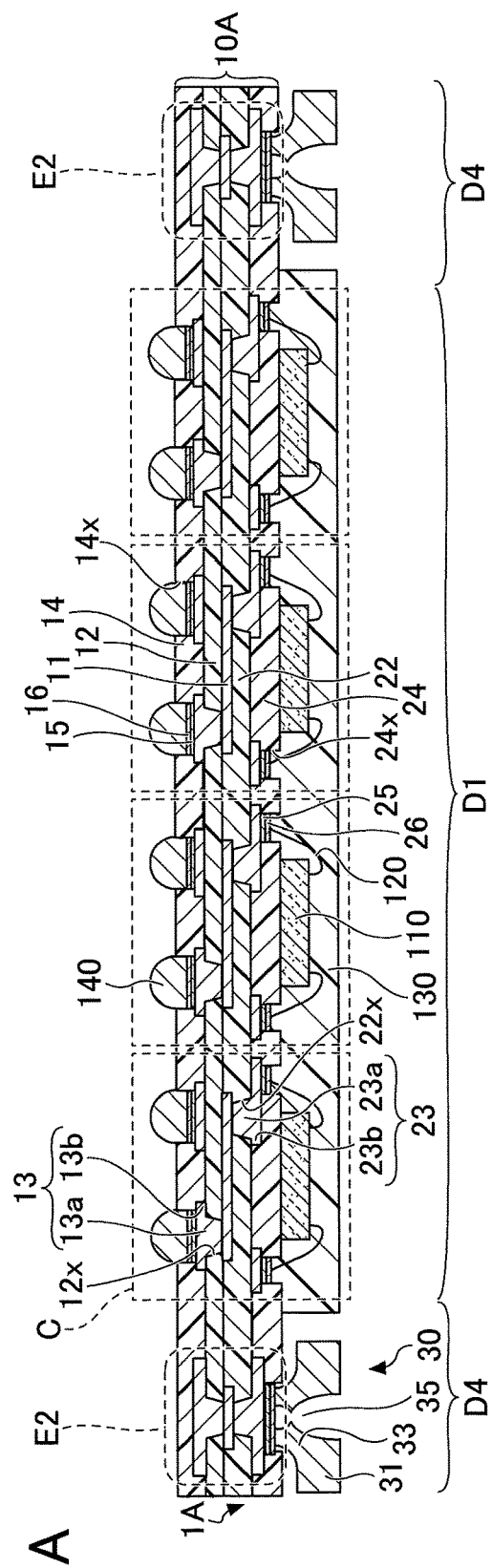
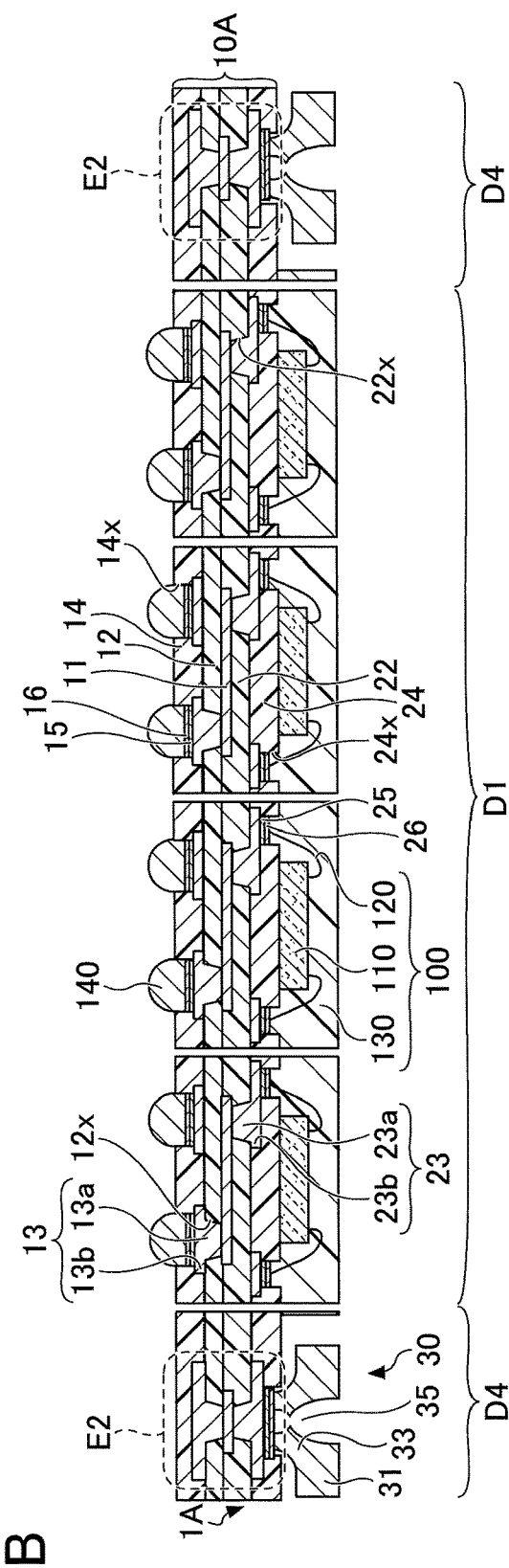
FIG.9A
FIG.9B

SUBSTRATE-WITH-SUPPORT

CROSS-REFERENCE TO RELATED APPLICATION

This application is based upon and claims priority to Japanese Patent Application No. 2018-003323, filed on Jan. 12, 2018, the entire contents of which are incorporated herein by reference.

FIELD

The embodiments discussed herein relate to a substrate-with-support.

BACKGROUND

A substrate for mounting a semiconductor chip on which a semiconductor chip is mounted to be a part of a semiconductor package is known. In accordance with demands for semiconductor packages having a lower profile, the total thickness of substrates to be applied is also required to be thin.

For example, although a coreless substrate is suitable for thinning due to not having a core, handling of the substrate becomes difficult as the thickness of the substrate is reduced, and it becomes difficult to assemble a semiconductor package including mounting of a semiconductor chip and the like.

Therefore, in order to improve handling, a substrate-with-support is proposed in which an insulating layer and a wiring layer are sequentially stacked on a support such as a metal plate. With this substrate-with-support, it is possible to easily mount a semiconductor chip or the like by enhancement of the strength due to the presence of the support. After completing the mounting of the semiconductor chip, the semiconductor chip is sealed with a resin, and thereafter the support is peeled off.

RELATED-ART DOCUMENTS

Patent Documents

[Patent Document 1] Japanese Laid-open Patent Publication No. 2010-50351
[Patent Document 2] Japanese Laid-open Patent Publication No. 2007-165513

However, because the entire back surface of the substrate-with-support described above is covered with the support, an external connection pad formed on the back surface is not exposed to the outside. Therefore, the substrate-with-support described above has a problem that it is impossible to perform an electric test that is carried out by applying a probe onto a pad such as an Open/Short test.

SUMMARY

According to an aspect of the embodiments, a substrate-with-support includes: a substrate having a wiring area, an outer peripheral area provided on an outer peripheral side of the wiring area, and a plurality of support joint portions being provided on the outer peripheral area; and a support made of metal having an outer frame portion arranged to face the outer peripheral area and to expose the wiring area, and a plurality of protruding portions being provided on the outer frame portion, wherein the support joint portions and the protruding portions are joined to each other.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIGS. 2A to 2C are diagrams illustrating an example of the substrate-with-support according to the first embodiment;
FIG. 3 is a plan view illustrating an example of a substrate constituting the substrate-with-support according to the first embodiment;
FIGS. 5A and 5B are diagrams illustrating an example of steps of manufacturing semiconductor packages using the substrate-with-support according to the first embodiment (part 1);
FIGS. 8A and 8B are diagrams illustrating an example of steps of manufacturing semiconductor packages using the substrate-with-support according to variation example 1 of the first embodiment (part 1);
FIGS. 9A and 9B are diagrams illustrating an example of steps of manufacturing the semiconductor packages using the substrate-with-support according to variation example 1 of the first embodiment (part 2)

DESCRIPTION OF EMBODIMENTS

Figure 1A:
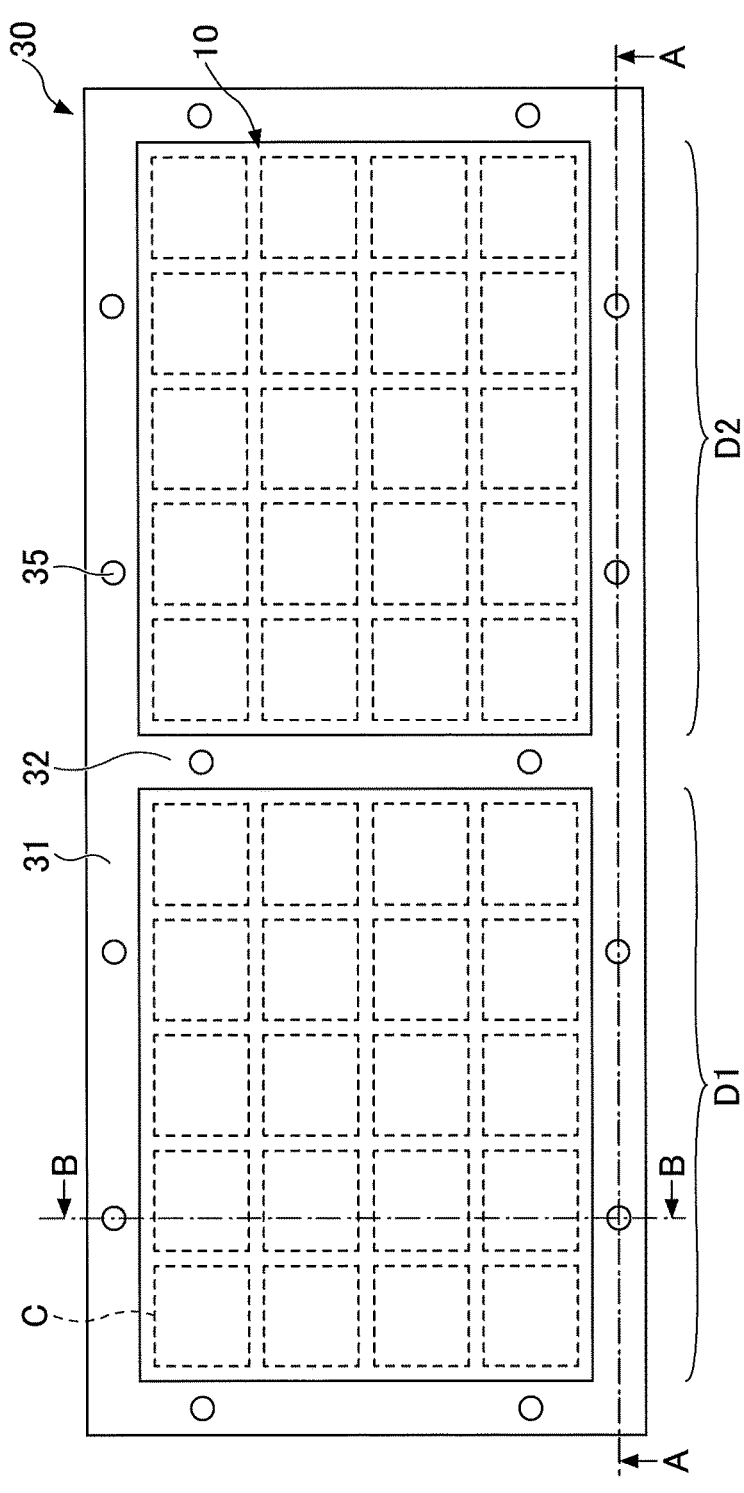
FIGS. 1A and 1B are diagrams illustrating an example of a substrate-with-support according to the first embodiment.

In the following, an embodiment will be described with reference to the accompanying drawings. Note that in these drawings, the same elements are referred to by the same reference numerals, and duplicate descriptions may be omitted as appropriate.

First Embodiment

[Structure of Substrate-with-Support]

Figure 1B:
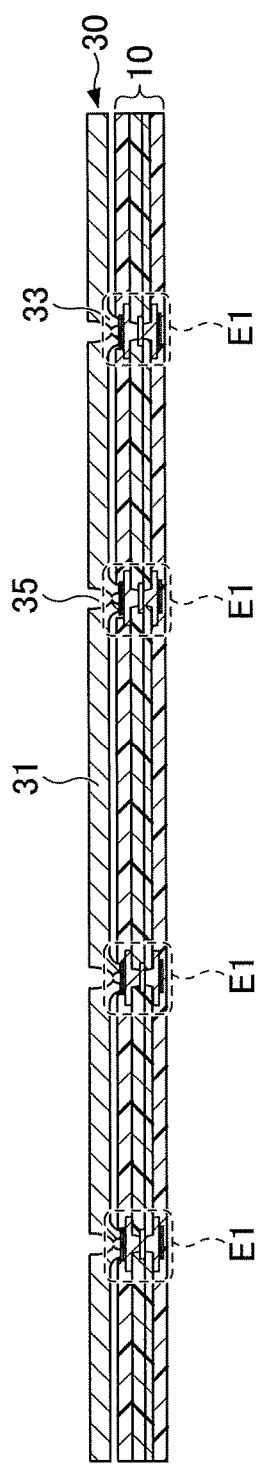

FIGS. 1A and 1B are diagrams illustrating an example of a substrate-with-support 1 according to a first embodiment (part 1). FIG. 1A is a plan view of the substrate-with-support 1, and FIG. 1B is a cross-sectional view of the substrate-with-support 1 taken along the line A-A of FIG. 1A. Also, FIGS. 2A to 2C are diagrams illustrating an example of the substrate-with-support 1 according to the first embodiment (part 2). FIG. 2A is a cross-sectional view of the substrate-with-support 1 taken along the line B-B of FIG. 1A, FIG. 2B is a partially enlarged cross-sectional view in the vicinity of an outer peripheral area D4 of FIG. 2A, and FIG. 2C is a view illustrating only a support 30 extracted from FIG. 2B.

FIG. 3 is a plan view illustrating an example of a substrate 10 constituting the substrate-with-support 1 according to the first embodiment.

With reference to FIGS. 1 to 3, the substrate-with-support 1 includes the substrate 10 and the support 30. The support 30 has a size that is substantially the same size as that of the substrate 10, and is joined to the substrate 10. As an example, the substrate 10 and the support 30 have a rectangular shape (oblong shape) in plan view.

(Substrate 10)

In the substrate 10, a first wiring area D1, in which a plurality of (twenty in the example of the first embodiment) areas C to be separated to be wiring substrates are arrayed vertically and horizontally, and a second wiring area D2, in which a plurality of (twenty in the example of the first embodiment) areas C to be separated to be wiring substrates are arrayed vertically and horizontally, are arranged via a separating area D3. A frame-shaped outer peripheral area D4 is provided on the outer peripheral side of the first wiring area D1, the second wiring area D2, and the separating area D3.

In other words, two areas sectioned by the frame-shaped outer peripheral area D4 and the separating area D3, separating the portion surrounded by the outer peripheral area D4 into a plurality of areas, are the first wiring area D1 and the second wiring area D2. For example, the separating area D3 can be formed so as to bridge the portions on the opposite long sides of the outer peripheral area D4 so as to divide the portion surrounded by the outer peripheral area D4 into two substantially equal parts.

Note that the substrate 10 is a substrate for mounting semiconductor chips on which semiconductor chips can be mounted. Therefore, after processes such as mounting the semiconductor chips on the substrate 10, mounting solder balls, and sealing with resin, the plurality of areas C are separated.

The substrate 10 includes a wiring layer 11, an insulating layer 12, a wiring layer 13, a solder resist layer 14, metal layers 15 and 16, an insulating layer 22, a wiring layer 23, a solder resist layer 24, and metal layers 25 and 26.

Note that according to the first embodiment, for convenience of description, the solder resist layer 14 side of the substrate 10 constituting the substrate-with-support 1 is referred to as an upper side or one side, and the solder resist layer 24 side of the substrate 10 is referred to as a lower side or the other side. Also, with respect to each part or element of the substrate-with-support 1, a solder resist layer 14 side surface is referred to as one surface or an upper surface, and a solder resist layer 24 side surface is referred to as the other surface or a lower surface. Note that the substrate-with-support 1, however, may be used in an inverted position or may be oriented at a desired angle. Also, a plan view refers to a view of an object taken in a direction normal to one surface of the insulating layer 12, and a planar shape refers to the shape of an object viewed in a direction normal to one surface of the insulating layer 12.

In the substrate 10, the wiring layer 11 is formed on the lower surface of the insulating layer 12. As a material of the wiring layer 11, for example, copper (Cu) or the like can be used. For example, the thickness of the wiring layer 11 may be in a range of approximately 2 μm to approximately 10 μm.

The insulating layer 12 covers the upper surface of the wiring layer 11. As a material of the insulating layer 12, for example, a thermosetting insulating resin whose main component is an epoxy resin, an imide resin, a phenolic resin, a cyanate resin or the like can be used. The thermosetting insulating resin used as the insulating layer 12 may be a non-photosensitive insulating resin or may be a photosensitive insulating resin. Also, the insulating layer 12 may include a reinforcing member made of a nonwoven fabric or a woven fabric such as glass fiber or aramid fiber. Also, the insulating layer 12 may include a filler such as silica ($SiO_2$). The thickness of the insulating layer 12 can be, for example, in a range of approximately 10 μm to approximately 30 μm.

The wiring layer 13 is formed on the upper surface side of the insulating layer 12 and is electrically connected to the wiring layer 11. The wiring layer 13 is configured to include via wirings 13a filling via holes 12x that penetrate the insulating layer 12 and expose the upper surface of the wiring layer 11 and include a wiring pattern 13b formed on the upper surface of the insulating layer 12. As a material of the wiring layer 13, for example, copper (Cu) or the like can be used. The thickness of the wiring pattern 13b constituting the wiring layer 13 can be, for example, in a range of approximately 2 μm am to approximately 10 μm.

For example, each of the via holes 12x can be a recessed portion having an inverted truncated cone shape in which the diameter of the opening portion opened on the wiring layer 13 side is larger than the diameter of the bottom surface of the opening portion formed by the upper surface of the wiring layer 11. The diameter of the opening portion of each of the via holes 12x on the wiring layer 13 side can be, for example, approximately 200 μm.

The solder resist layer 14 is an insulating layer formed on the upper surface of the insulating layer 12 so as to cover the wiring layer 13. As a material of the solder resist layer 14, for example, a thermosetting insulating resin whose main component is a phenolic resin, a polyimide resin or the like can be used. The solder resist layer 14 may include a filler such as silica ($SiO_2$).

The solder resist layer 14 has opening portions 14x, and a part of the wiring layer 13 is exposed in each of the opening portions 14x. The wiring layer 13 exposed in each of the opening portions 14x functions as a pad to which an external connection terminal such as a solder ball is connected, for example. The thickness of the solder resist layer 14 can be, for example, in a range of approximately 10 μm to approximately 20 μm. The planar shape of each of the opening portions 14x may be, for example, a circular shape having a diameter of approximately 300 μm.

Metal layers 15 and 16 are sequentially stacked on the upper surface of the wiring layer 13 exposed in the opening portions 14x. The metal layers 15 and 16 are surface treatment layers for enhancing the connection reliability with external connection terminals such as solder balls and can be provided as needed. As the metal layer 15, for example, nickel (Ni) or the like can be used. The thickness of the metal layer 15 can be, for example, in a range of approximately 0.2 μm to 1 μm. As the metal layer 16, for example, gold (Au) or the like can be used. The thickness of the metal layer 16 can be, for example, in a range of 0.01 μm to 0.05 μm. Another metal layer such as palladium (Pd) may be further stacked between the metal layer 15 and the metal layer 16.

The insulating layer 22 is formed on the lower surface of the insulating layer 12 so as to cover the lower surface and the side surface of the wiring layer 11. The material and the thickness of the insulating layer 22 can be, for example, similar to those of the insulating layer 12. The insulating layer 22 may include a reinforcing member made of a nonwoven fabric or a woven fabric such as glass fiber or aramid fiber. Also, the insulating layer 22 may include a filler such as silica ($SiO_2$).

The wiring layer 23 is formed on the lower surface side of the insulating layer 22 and is electrically connected to the wiring layer 11. The wiring layer 23 is configured to include via wirings 23a filling via holes 22x that penetrate the insulating layer 22 and expose the lower surface of the wiring layer 11 and a wiring pattern 23b formed on the lower surface of the insulating layer 22. The material of the wiring layer 23 and the thickness of the wiring pattern 23b constituting the wiring layer 23 can be similar to those for the wiring layer 13, for example.

For example, each of the via holes 22x can be a recessed portion having a truncated cone shape in which the diameter of the opening portion opened on the wiring layer 23 side is larger than the diameter of the bottom surface of the opening portion formed by the lower surface of the wiring layer 11. The diameter of the opening portion of each of the via holes 22x on the wiring layer 23 side can be, for example, approximately 200 μm.

The solder resist layer 24 is an insulating layer formed on the lower surface of the insulating layer 22 so as to cover the wiring layer 23. The material and thickness of the solder resist layer 24 can be, for example, similar to those of the solder resist layer 14. The solder resist layer 24 may include a filler such as silica ($SiO_2$).

The solder resist layer 24 has opening portions 24x, and a part of the wiring layer 23 is exposed in each of the opening portions 24x. The wiring layer 23 exposed in each of the opening portions 24x functions, for example, as a pad connected to a semiconductor chip. The planar shape of each of the opening portions 24x can be, for example, a circular shape having a diameter of approximately 300 μm.

Metal layers 25 and 26 are sequentially stacked on the lower surface of the wiring layer 23 exposed in the opening portions 24x. The metal layers 25 and 26 are surface treatment layers for enhancing the connection reliability with bonding wires or the like for connection with semiconductor chips, and can be provided as needed. The material and the thickness of the metal layers 25 and 26 can be similar to those of the metal layers 15 and 16, for example. Another metal layer such as palladium (Pd) may be further stacked between the metal layer 25 and the metal layer 26.

On the separating area D3 and the outer peripheral area D4 of the substrate 10, a plurality of support joint portions E1 are discretely provided. The support joint portions E1 are portions that are joined to the support 30. The number of the support joint portions E1 and the positions at which the support joint portion E1 are provided can be determined as appropriate in consideration of the joint strength and the like required between the substrate 10 and the support 30.

The respective support joint portions E1 are conductor portions provided in the insulating layers 12 and 22 and the solder resist layers 14 and 24 constituting the substrate 10. Each of the support joint portions E1 has a wiring layer structure similar to that in the first wiring area D1 and the second wiring area D2 of the substrate 10. More specifically, each of the support joint portions E1 has a conductor portion having a columnar structure, in which the wiring pattern 23b, the via wiring 23a, the wiring layer 11, the via wiring 13a, the wiring pattern 13b, the metal layer 15, and the metal layer 16 are formed to have substantially circular shapes as their respective planar shapes and these are substantially concentrically stacked. Note that the wiring layers 13 and 23 of the support joint portions E1 are electrically separated from the wiring layers 13 and 23 of the areas C to be separated as wiring substrates.

The columnar structure of each of the support joint portions E1 includes the via wiring 13a formed in the insulating layer 12 and the via wiring 23a formed in the insulating layer 22. Further, the via wiring 13a and the via wiring 23a are of a stack via structure in which the via wiring 13a and the via wiring 23a are arranged to face each other via the wiring layer 11, and form a part of the columnar structure of the conductor portion.

Each of the support joint portions E1 is formed across the plurality of insulating layers (the insulating layers 12 and 22 and the solder resist layers 14 and 24), and the upper surface of the metal layer 16 serves as exposed portions exposed in the respective opening portions 14x of the solder resist layer 14 and joined to the support 30.

Note that the metal layers 25 and 26 are not provided in the support joint portions E1. For the substrate 10, after forming the wiring layers 13 and 23, the solder resist layers 14 and 24 having the opening portions 14x and 24x are formed on the wiring layers 13 and 23. At this time, the wiring layer 23 of the support joint portions E1 is covered with the solder resist layer (because there is no need to expose from the solder resist layer 24, an opening portion 24x is not formed). Thereafter, on the wiring layers 13 and 23 exposed from the opening portions 14x and 24x of the solder resist layers 14 and 24, the metal layers 15, 16, 25 and 26 are formed by plating. Therefore, the metal layers 25 and 26 are not provided on the wiring layer 23 of each of the support joint portions E1 where an opening portion 24x is not formed.

The substrate 10 is a substrate for mounting semiconductor chips on which semiconductor chips can be mounted. The total thickness of the substrate 10 (the thickness from the lower surface of the solder resist layer 24 to the upper surface of the solder resist layer 14) is in a range of approximately 50 μm to approximately 100 μm, and the substrate 10 does not have sufficient strength. Therefore, by the substrate 10 alone, handling in steps of manufacturing semiconductor packages, such as mounting semiconductor chips and mounting solder balls is difficult. Therefore, in order to improve the strength, the support 30 described below is bonded to the substrate 10.

(Support 30)

The support 30 includes an outer frame portion 31 that is arranged to face the outer peripheral area D4 of the substrate 10 and a bridge portion 32 that is arranged to face the separating area D3 of the substrate 10. For example, the bridge portion 32 can be formed so as to bridge the portions on the opposite long sides of the outer frame portion 31 so as to divide the space surrounded by the outer frame portion 31 into two substantially equal parts. The first wiring area D1 and the second wiring area D2 of the substrate 10 are exposed from the outer frame portion 31 and the bridge portion 32 of the support 30. The support 30 is made of metal, and the outer frame portion 31 and the bridge portion 32 are integrally formed of a metal material such as copper (Cu), for example.

On the support 30, a plurality of protruding portions 33 are provided on the side of the outer frame portion 31 facing the outer peripheral area D4 of the substrate 10 and on the side of the bridge portion 32 facing the separating area D3 of the substrate 10. For example, each of the protruding portions 33 can have a shape that reduces in width as it goes toward the tip (toward the substrate 10). The planar shape of the tip side of the each of the protruding portion 33 is, for example, a circular shape, and in this case, the diameter $\varphi_1$ can be approximately 250 μm, for example. The thickness $T_1$ of the outer frame portion 31 and the bridge portion 32 (the thickness of the support 30 at portions where the protruding portions 33 are not formed) can be, for example, approximately 130 μm. The thickness $T_2$ of each of the protruding portions 33 (amount of protrusion) can be, for example, approximately 70 μm.

In the support 30, through holes 35 penetrating the outer frame portion 31 and the protruding portions 33 in the thickness direction are provided. Similarly, through holes 35 penetrating the bridge portion 32 and the protruding portions 33 in the thickness direction are provided. It is preferable to provide the through holes 35 at positions out of the extension lines of the division lines (broken lines indicating the areas C). With such an arrangement, it is possible to prevent a contact between a blade and the support 30 when separating the areas C into individual pieces.

Each of the through holes 35 is formed, for example, such that a first hole 35x and a second hole 35y are in communication, in which the first hole 35x is opened on the outer side of the outer frame portion 31 or the bridge portion 32 and whose opening size decreases toward the protruding portion 33, and the second hole 35y is opened on the tip side of the protruding portion 33 and whose opening size decreases toward the first hole 35x. For each of the through holes 35, a minimum opening portion 35z, whose opening is the smallest within the through hole 35, is formed on the support joint portion E1 side with respect to the center in the thickness direction of an inner wall of the through hole 35. Each of the minimum opening portions 35z is a portion where the first hole 35x and the second hole 35y are in communication and is a portion that protrudes most toward the center within the through hole 35.

The planar shape of the maximum opening portion of each of the first holes 35x is circular, for example, and in this case, the diameter $\varphi_2$ can be, for example, approximately 200 μm. The planar shape of the maximum opening portion of each of the second holes 35y is circular, for example, and in this case, the diameter $\varphi_3$ can be, for example, approximately 150 μm. The planar shape of each of the minimum opening portions 35z is circular, for example, and in this case, the diameter $\varphi_4$ can be, for example, approximately 100 μm.

The protruding portions 33 are provided at positions corresponding to the respective support joint portions E1 provided on the outer peripheral area D4 and the separating area D3 of the substrate 10. Then, the support joint portions E1, provided on the outer peripheral area D4, and the protruding portions 33, provided on the outer frame portion 31, are joined to each other, and the support joint portions E1, provided on the separating area D3, and the protruding portions 33, provided on the bridge portion 32, are joined to each other. Specifically, the upper surface of the metal layer 16 of the support joint portions E1 exposed in the opening portions 14x of the solder resist layer 14 is in contact with the tips of the protruding portions 33, such that the support joint portions E1 and the protruding portion 33 are joined to each other.

Note that only the tips of the protruding portions 33 of the support 30 are joined to the substrate 10, and a gap is formed between the outer peripheral area D4 of the substrate 10 and the lower surface of the outer frame portion 31 of the support 30 (area where the protruding portions 33 are not formed). Similarly, a gap is formed between the separating area D3 of the substrate 10 and the lower surface of the bridge portion 32 of the support 30 (area where the protruding portions 33 are not formed).

The support joint portions E1 and the protruding portions 33 can be joined by, for example, welding. In this case, at least part of the protruding portions 33 and the support joint portions E1 are integrated to form welded portions F. In a case where the support joint portions E1 and the protruding portions 33 are joined by welding, it is preferable to form a main part of the support joint portions E1 and the support 30 with a same material such as copper or a copper alloy.

For example, the wiring layers 11, 13, and 23 of the support joint portions E1 are formed of copper or a copper alloy, and the support 30 is also made of copper or a copper alloy. In this case, even when metal layers 15 and 16 made of another material are interposed between the wiring layer 13 of the support joint portions E1 and the protruding portions 33 of the support 30, the support joint portions E1 and the protruding portion 33 of the support 30 can be laser-welded.

In the laser welding, for example, the inner wall side of the through hole 35 including the minimum opening portion 35z of the protruding portion 33, the center side of the metal layers 15 and 16, the center side of the wiring pattern 13b and the via wiring 13a are melted and integrated to form each welded portion F. However, the ranges in which welded portions F formed differ depending on the position to which the laser is emitted, emission power of the laser, and the like, and the welded portion F illustrated in FIG. 2 B is an example.

[Method of Manufacturing Substrate-with-Support]

Figure 4A:
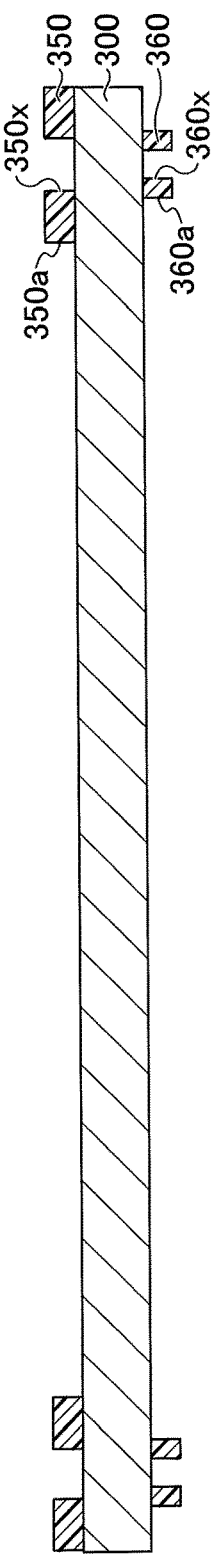
FIGS. 4A to 4C are diagrams illustrating an example of steps of manufacturing the substrate-with-support according to the first embodiment.
Figure 4B:
Figure 4C:
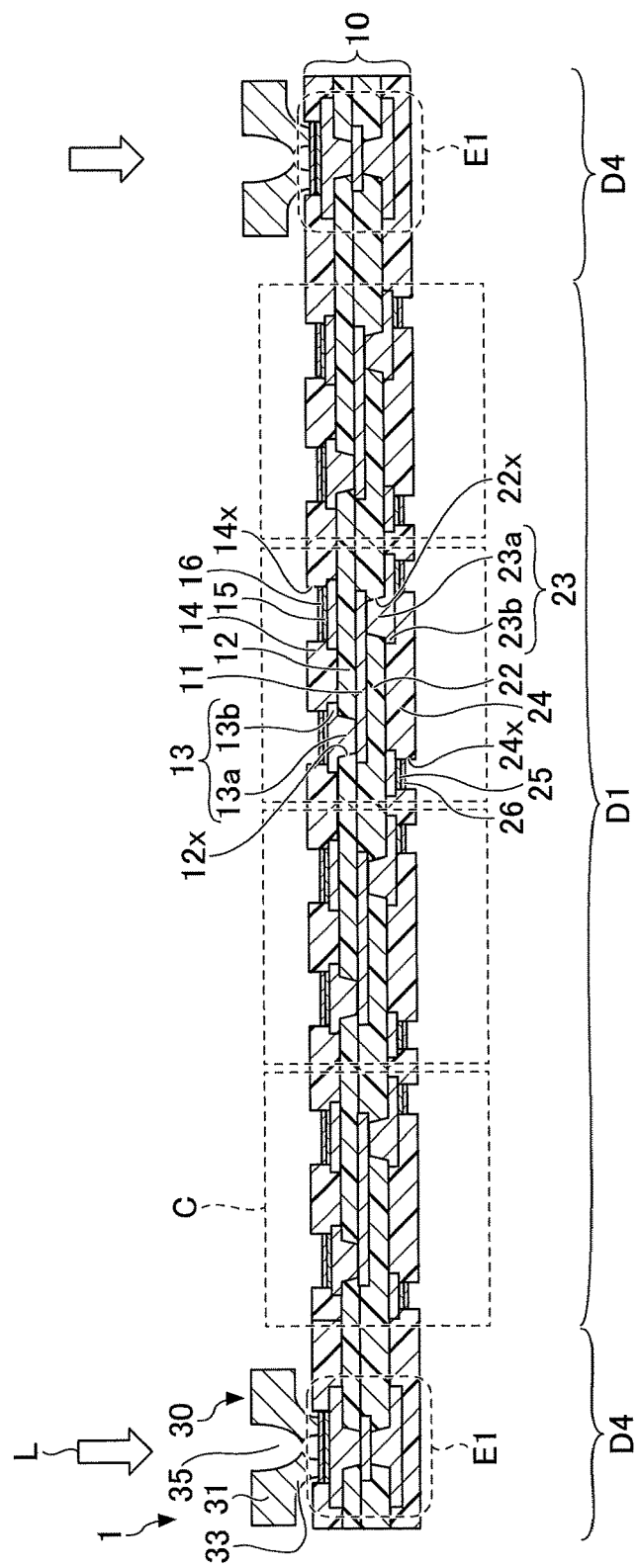

Next, a method of manufacturing the substrate-with-support 1 according to the first embodiment will be described. FIGS. 4A to 4C are diagrams illustrating an example of the steps of manufacturing the substrate-with-support 1 according to the first embodiment, and illustrate cross sections corresponding to FIG. 2A.

First, in the step illustrated in FIG. 4A, a metal plate 300 (for example, a copper plate) for manufacturing the support 30 is prepared. The thickness of the metal plate 300 can be, for example, approximately 200 μm. Next, a photosensitive dry film resist or the like is formed on the entire upper surface of the metal plate 300, exposed and developed to form a resist layer 350 having opening portions 350x. Similarly, a photosensitive dry film resist or the like is formed on the entire lower surface of the metal plate 300, and exposed and developed to form a resist layer 360 having opening portions 360x. In the resist layers 350 and 360, opening portions 350a and 360a are provided at locations corresponding to the first wiring area D1 and the second wiring area D2.

Next, in the step illustrated in FIG. 4B, using the resist layers 350 and 360 as etching masks, the metal plate 300 is half-etched from both sides. After the half etching, the resist layers 350 and 360 are removed. Thereby, the support 30 made of metal having the outer frame portion 31 and the bridge portion 32 having the planar shape as illustrated in FIG. 1A and provided with the protruding portions 33 (including the through holes 35) having the cross-sectional shape as illustrated in FIG. 2 on the lower surface of the outer frame portion 31 and the lower surface of the bridge portion 32 is prepared. In a case where the metal plate 300 is a copper plate, the metal plate 300 can be half-etched using, for example, a cupric chloride aqueous solution.

Note that in each area where the opening portion 350x and the opening portion 360x overlap in plan view, the metal plate 300 is half-etched from both sides to penetrate the metal plate 300. In particular, in each portion where the through hole 35 is formed, by making the opening diameter of the opening portion 350x larger than the opening diameter of the opening portion 360x, the minimum opening portion 35z, which is the portion where the first hole 35x and the second hole 35y are in communication, can be located below the center in the thickness direction of the inner wall of the through hole 35.

Next, in the step illustrated in FIG. 4C, the substrate 10 illustrated in FIGS. 1 to 3 is prepared. The substrate 10 can be formed by, for example, a known build-up method or the like. Then, the support 30 is joined to the substrate 10. Here, an example of joining the support 30 to the substrate 10 by welding is described.

Specifically, the support 30 is arranged on the substrate 10 such that the tips of the respective protruding portions 33 of the support 30 contact the metal layer 16, which serves as the exposed portions of the support joint portions E1 of the substrate 10. Then, laser light L is emitted into the through holes 35 from the first hole 35x side. Note that a part of the laser light L may be emitted to the outside of the through holes 35. As the laser used here, it is possible to select a laser capable of emitting a wavelength that is sufficiently absorbed with respect to a material constituting the support joint portions E1 and the protruding portions 33. For example, a green laser can be used when the material constituting the support joint portions E1 and the protruding portions 33 is copper or a copper alloy.

Here, because the minimum opening 35z protrudes most toward the center within each of the through holes 35, the laser light L, emitted into each of the through holes 35, is emitted to the vicinity of the minimum opening portion 35z and to the metal layer 16 passing through the through hole 35. Heat generated in the vicinity of the minimum opening portions 35z by the minimum opening portions 35z being irradiated with the laser light L is transmitted to the areas overlapping with the vicinity of the minimum opening portions 35z of the support joint portions E1 in plan view. Also, heat generated in the metal layer 16 by the metal layer 16 being irradiated with the laser light L is transmitted to surroundings of the metal layer 16. As a result, the portions to which the heat is transmitted are melted and joined to each other to form welded portions F (see FIG. 2B). At this time, because each of the support joint portions E1 has a columnar structure and is sufficiently thick, there is no possibility of being damaged by irradiation with the laser light L. Through the above steps, the substrate-with-support 1 is completed.

Subsequently, steps of mounting semiconductor chips 110 on the substrate-with-support 1 to manufacture semiconductor packages 100 will be described. FIGS. 5A and 5B and FIGS. 6A and 6B are diagrams illustrating an example of the steps of manufacturing the semiconductor packages 100 using the substrate-with-support 1 according to the first embodiment, and illustrate cross sections corresponding to FIG. 2A.

First, in the step illustrated in FIG. 5A, the substrate-with-support 1 is turned upside down with respect to FIG. 4C and placed on a heater plate 400 having a flat plate portion 410 and a protruding portion 420. At this time, the substrate-with-support 1 is held on the heater plate 400 in a state where the support 30 is in contact with the upper surface of the flat plate portion 410 and the solder resist layer 14 is in contact with the upper surface of the protruding portion 420. Next, the semiconductor chips 110 are mounted on the respective areas C of the substrate-with-support 1. Specifically, for example, on the solder resist layer 24 of each of the areas C, the corresponding one of the semiconductor chips 110 is fixed in a face-up state via a die attach film or the like (not illustrated). Then, for example, while heating electrodes (not illustrated) of the semiconductor chips 110 and the metal layer 26 exposed in the opening portions 24x of the solder resist layer 24 with the heater plate 400, metal wires 120 such as copper wires or gold wires are electrically connected by wire bonding. Note that the semiconductor chips 110 may be flip-chip mounted on the substrate-with-support 1.

Next, in the step illustrated in FIG. 5B, the substrate-with-support 1, on which the semiconductor chips 110 are mounted, is detached from the heater plate 400, turned upside down, and set in a mold for resin sealing. Specifically, the substrate-with-support 1, on which the semiconductor chips 110 are mounted, is sandwiched by a lower mold 500 having a frame portion 510 and a cavity portion 520 and an upper mold 600 having a flat plate portion 610 and a protruding portion 620. At this time, in a state in which the solder resist layer 24 of the support joint portions E1 is in contact with the upper surface of the frame portion 510, the support 30 is in contact with the lower surface of the flat plate portion 610, and the solder resist layer 14 of the first wiring area D1 and the second wiring area D2 is in contact with the lower surface of the protruding portion 620, the substrate-with-support 1 is held between the lower mold 500 and the upper mold 600. Then, a resin is injected into the cavity portion 520 and hardened, thereby forming a sealing resin (encapsulation resin) 130 covering the semiconductor chips 110 and the metal wires 120.

Figure 6A:
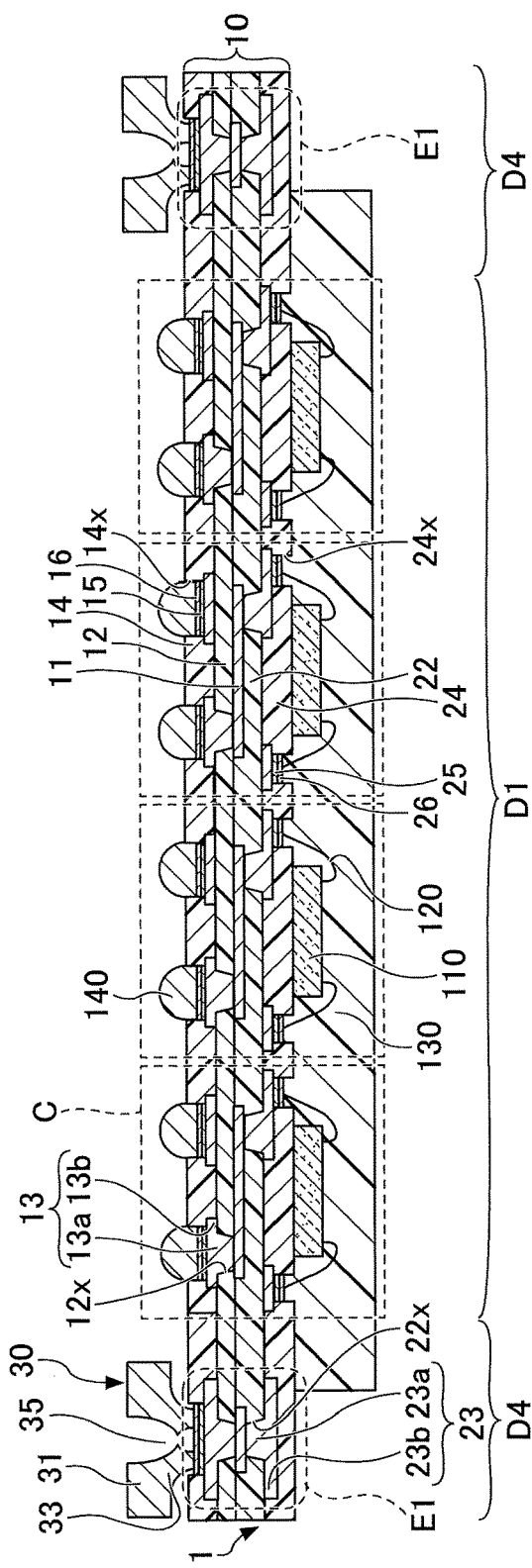
FIGS. 6A and 6B are diagrams illustrating an example of steps of manufacturing the semiconductor packages using the substrate-with-support according to the first embodiment (part 2)

Next, in the step illustrated in FIG. 6A, the substrate-with-support 1, on which the sealing resin 130 is formed, is detached from the lower mold 500 and the upper mold 600, and solder balls 140 are formed on the metal layer 16 exposed in the opening portions 14x of the solder resist layer 14. For example, the solder balls 140 can be famed by after applying a flux as a surface treatment agent on the metal layer 16 exposed in the opening portions 14x, mounting solder balls, reflowing at a temperature of approximately 240° C. to 260° C., and thereafter cleaning the surface to remove the flux.

Figure 6B:
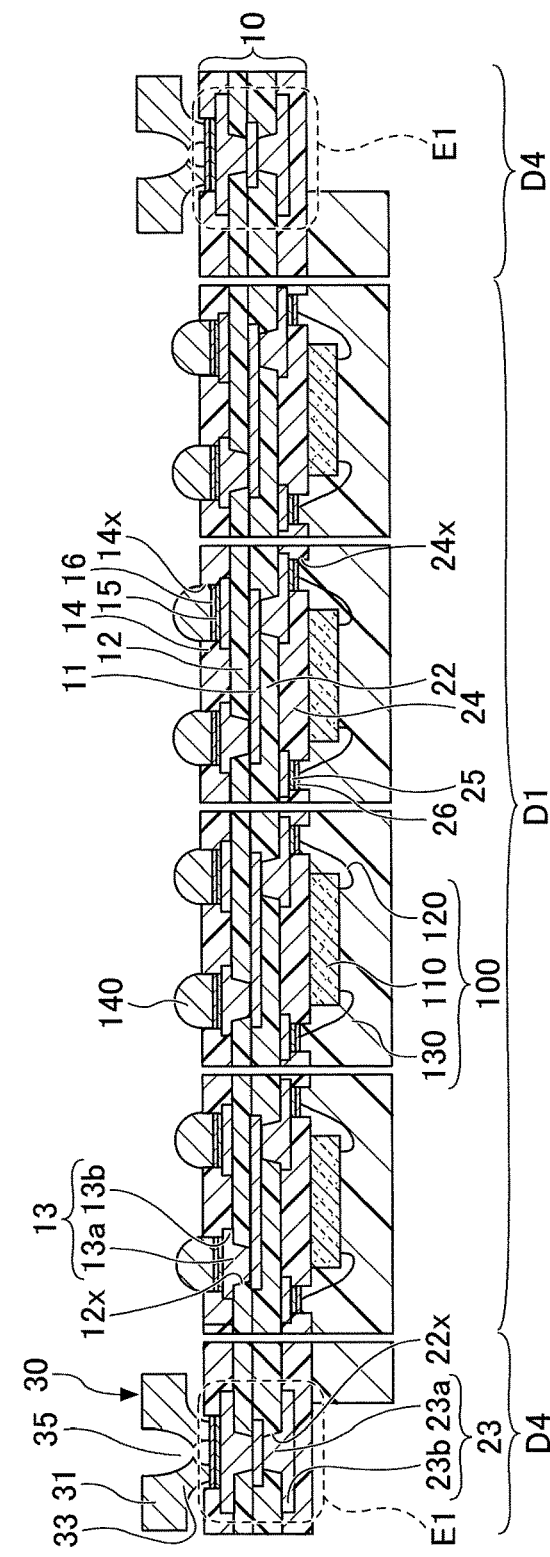

Next, in the step illustrated in FIG. 6B, the respective areas C are separated by using a slicer or the like. Thereby, a plurality of semiconductor packages 100 are completed. At the same time, the outer peripheral area D4 and the separating area D3 of the substrate 10 are separated from the semiconductor packages 100 together with the support 30. Note that because the semiconductor packages 100 have sufficient strength by the sealing resin 130, even without the support 30, there is no problem in handling thereafter.

In this manner, in the substrate-with-support 1, because the support 30 made of metal, whose size is substantially the same size as that of the substrate 10, is joined on the substrate 10, handling in the manufacturing processes of semiconductor packages can be enhanced.

Also, because the first wiring area D1 and the second wiring area D2 of the substrate 10 are exposed from the support 30, a process flow that is the same as that for a conventional substrate without a support can be adopted. That is, it is possible to carry out an electrical test by applying probe to pads formed on the front and rear surfaces of the first wiring area D1 and the second wiring area D2 of the substrate 10, and to check the appearance quality of the front and rear surfaces of the first wiring area D1 and the second wiring area D2. Therefore, it is possible to determine whether a single substrate-with-support 1 is a good product or a defective good product. Thus, because only good products can be put into the steps of manufacturing process of semiconductor packages, the yield rate of semiconductor packages can be enhanced.

Also, although the support 30 is joined to the substrate 10 by joining the protruding portions 33 of the support 30 to the support joint portions E1 of the substrate 10, exposed portions (on the upper surface of the metal layer 16), joined with the protruding portions 33, of the support joint portions E1 are recessed portions recessed by one step from the surface of the solder resist layer 14. Therefore, it is possible to easily position the protruding portions 33 on the upper surface of the metal layer 16 in the recessed portions.

Also, the through holes 35 are provided in the portions of the protruding portions 33 of the support 30, and in each of the through holes 35, the minimum opening portion 35z, which protrudes most toward the center in the through hole 35, is provided. Thus, when the support 30 is joined to the substrate by lase wielding, the laser light L, emitted into the through holes 35s, is emitted to the vicinities of the minimum opening portions 35z and to the metal layer 16 passing through the through holes 35. Therefore, the support 30 can be joined to the substrate with a small irradiation power. Thereby, thermal damage of the substrate 10 can be suppressed.

Also, by locating the minimum opening portion 35z below the center in the thickness direction of the inner wall in each of the through holes 35, the melted portions of the support 30 and the substrate 10 come close to each other, and therefore the support 30 can be joined to the substrate 10 with a further smaller irradiation power. Thereby, thermal damage of the substrate 10 can be further suppressed.

Also, by providing the protruding portions 33 on the support 30, a gap is formed between the outer peripheral area D4 of the substrate 10 and the lower surface of the outer frame portion 31 of the support 30 and between the separating area D3 of the substrate 10 and the lower surface of the bridge portion 32. Thus, it is possible to prevent teeth of a blade used for cutting from being into contact with the support 30 by cutting from the opposite side of the support 30 at the time of separation, and it is possible to avoid shortening the life of the blade.

Note that an example in which the number of areas C in each of the first wiring area D1 and the second wiring area D2 of the substrate 10 is twenty is described. The number of areas C in the first wiring area D1 and the second wiring area D2 can be determined as suited. Also, without providing a separating area D3, one wiring area may be defined only by an outer peripheral area D4. Alternatively, a plurality of separating areas D3 may be provided such that a plurality of wiring areas are defined by the plurality of separating areas D3 and the outer peripheral area D4. Alternatively, a separating area D3 having a cross shape or the like may be provided such that a plurality of wiring areas are defined by the separating area D3 having a cross shape or the like and the outer peripheral area D4. The shape of the support 30 is determined in accordance with the shapes of the separating area(s) D3 and the outer peripheral area D4 of the substrate 10, and in any case, the shape of the support 30 is formed to expose the wiring area(s).

<Variation Example 1 of First Embodiment>

Although an example in which the support 30 is provided on the solder ball mounting side of the substrate is described in the first embodiment, as variation example 1 of the first embodiment, an example in which the support 30 is provided on the semiconductor chip mounting side of the substrate is described. Note that in variation example 1 of the first embodiment, descriptions of constituent elements that are the same as those of the first embodiment previously described may be omitted as appropriate.

Figure 7A:
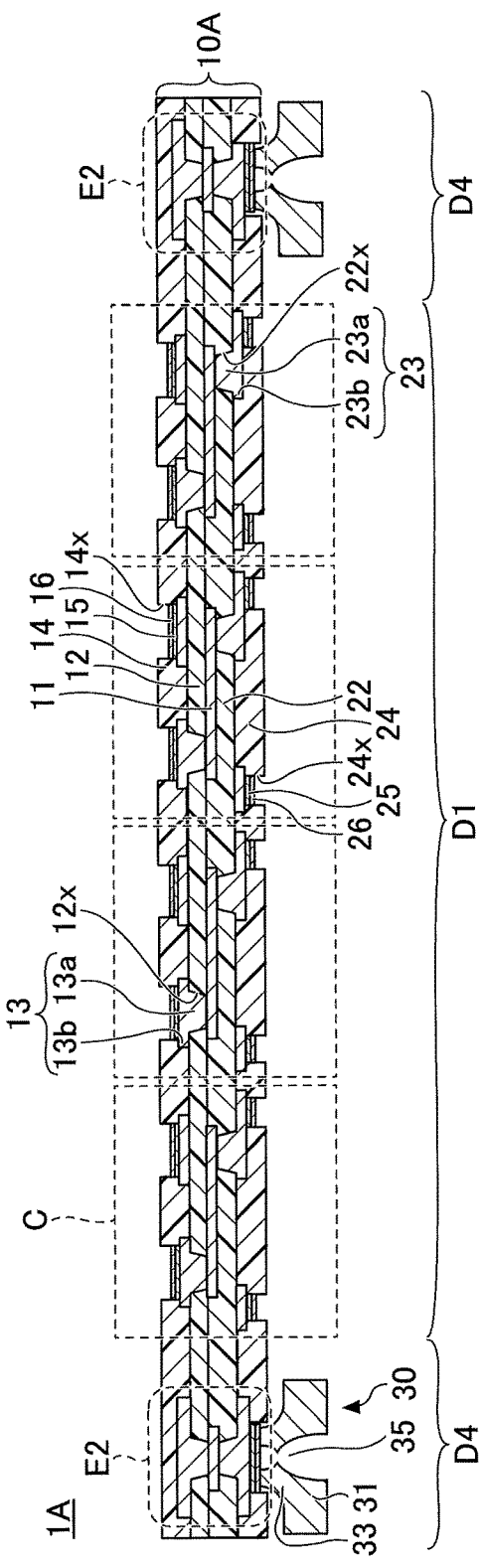
FIGS. 7A and 7B are diagrams illustrating an example of a substrate-with-support according to variation example 1 of the first embodiment.
Figure 7B:
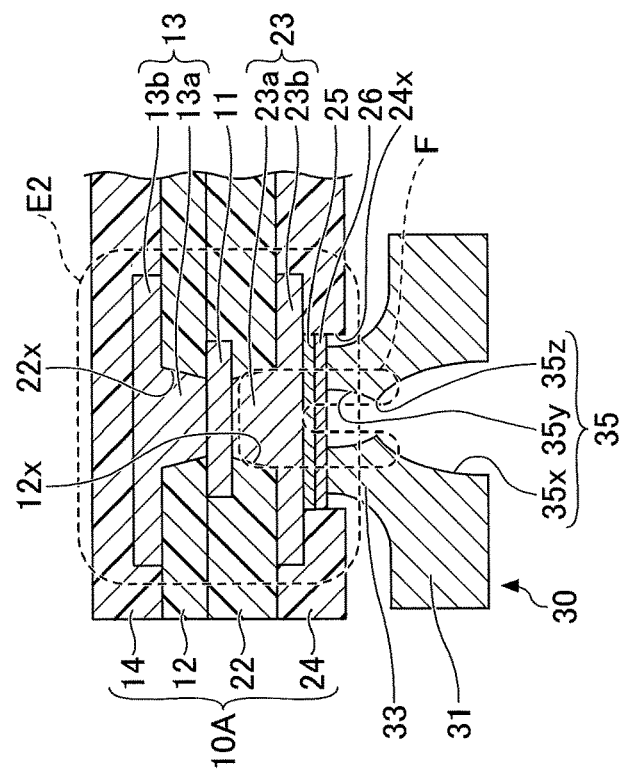

FIGS. 7A and 7B are diagrams illustrating an example of a substrate-with-support 1A according to variation example 1 of the first embodiment. FIG. 7A is a cross-sectional view of the substrate-with-support 1A corresponding to FIG. 2A, and FIG. 7B is a partially enlarged cross-sectional view in the vicinity of the outer peripheral area D4 of FIG. 7A.

With reference to FIGS. 7A and 7B, the substrate-with-support 1A differs from the substrate-with-support 1 (refer to FIG. 2 and the like) in that the substrate 10 having the support joint portions E1 are replaced with a substrate 10A having support joint portions E2. In the substrate 10A, the wiring pattern 13b is covered by the solder resist layer 14, and the lower surface of the metal layer 26 constituting the support joint portion E2 is exposed in the opening portions 24x of the solder resist layer 24. Note that due to a reason similar to that in the first embodiment, the metal layers 15 and 16 are not provided in the support joint portions E2.

In the substrate-with-support 1A, the support 30 is joined to the solder resist layer 24 side of the substrate 10A. Specifically, in the substrate-with-support 1A, the lower surface of the metal layer 26 of the support joint portions E2 exposed in the opening portions 24x of the solder resist layer 24 is in contact with the tips of the protruding portions 33, such that the support joint portions E2 and the protruding portion 33 are joined to each other. The support joint portions E2 and the protruding portions 33 can be joined by, for example, welding.

The substrate-with-support 1A can be manufactured by steps similar to the steps illustrated in FIGS. 4A to 4C of the first embodiment. However, the tips of the respective protruding portions 33 of the support 30 are joined to the metal layer 26, which serves as the exposed portions of the support joint portions E2 of the substrate 10A.

Subsequently, steps of mounting semiconductor chips 110 on the substrate-with-support 1A to manufacture semiconductor packages 100 will be described. FIGS. 8A and 8B and FIGS. 9A and B are diagrams illustrating an example of the steps of manufacturing the semiconductor packages 100 using the substrate-with-support 1A according to variation example 1 of the first embodiment, and illustrate cross sections corresponding to FIG. 7A.

First, in the step illustrated in FIG. 8A, the substrate-with-support 1A is turned upside down with respect to FIG. 7A and placed on a heater plate 700. At this time, the substrate-with-support 1A is held on the heater plate 700 in a state where the solder resist layer is in contact with the upper surface of the heater plate 700. Next, similarly to the step illustrated in FIG. 5A of the first embodiment, the semiconductor chips 110 are mounted on the respective areas C of the substrate-with-support 1A.

Next, in the step illustrated in FIG. 8B, the substrate-with-support 1A, on which the semiconductor chips 110 are mounted, is detached from the heater plate 700, turned upside down, and set in a mold for resin sealing. Specifically, the substrate-with-support 1A, on which the semiconductor chips 110 are mounted, is sandwiched by a lower mold 800 having a flat plate portion 810 and a frame portion 820 protruding from the flat plate portion 810 and an upper mold 900 having a flat plate shape. At this time, in a state in which the support 30 is in contact with the upper surface of the flat plate portion 810, the solder resist layer 24 of the support joint portions E2 is in contact with the upper surface of the frame portion 820, and the solder resist layer 14 is in contact with the lower surface of the upper mold 900, the substrate-with-support 1A is held between the lower mold 800 and the upper mold 900. Then, a resin is injected into an area surrounded by the frame portion 820 and hardened, thereby forming the sealing resin 130 covering the semiconductor chips 110 and the metal wires 120.

Next, in the step illustrated in FIG. 9A, the substrate-with-support 1A, on which the sealing resin 130 is formed, is detached from the lower mold 800 and the upper mold 900, and similarly to the step illustrated in FIG. 6A of the first embodiment, solder balls 140 are formed on the metal layer 16 exposed in the opening portions 14x of the solder resist layer 14.

Next, in the step illustrated in FIG. 9B, the respective areas C are separated by using a slicer or the like. Thereby, a plurality of semiconductor packages 100 are completed. At the same time, the outer peripheral area D4 and the separating area D3 of the substrate 10A are separated from the semiconductor packages 100 together with the support 30. Note that because the semiconductor packages 100 have sufficient strength by the sealing resin 130, even without the support 30, there is no problem in handling thereafter.

In this way, even in a case where the support 30 is provided on the semiconductor chip mounting side of the substrate 10A, effects similar to those of the first embodiment can be obtained.

<Variation Example 2 of First Embodiment>

As Variation example 2 of the first embodiment, an example will be described whose layer structure of support joint portions differs from that that of the first embodiment. Note that in variation example 2 of the first embodiment, descriptions of constituent elements that are the same as those of the first embodiment previously described may be omitted as appropriate.

Figure 10A:
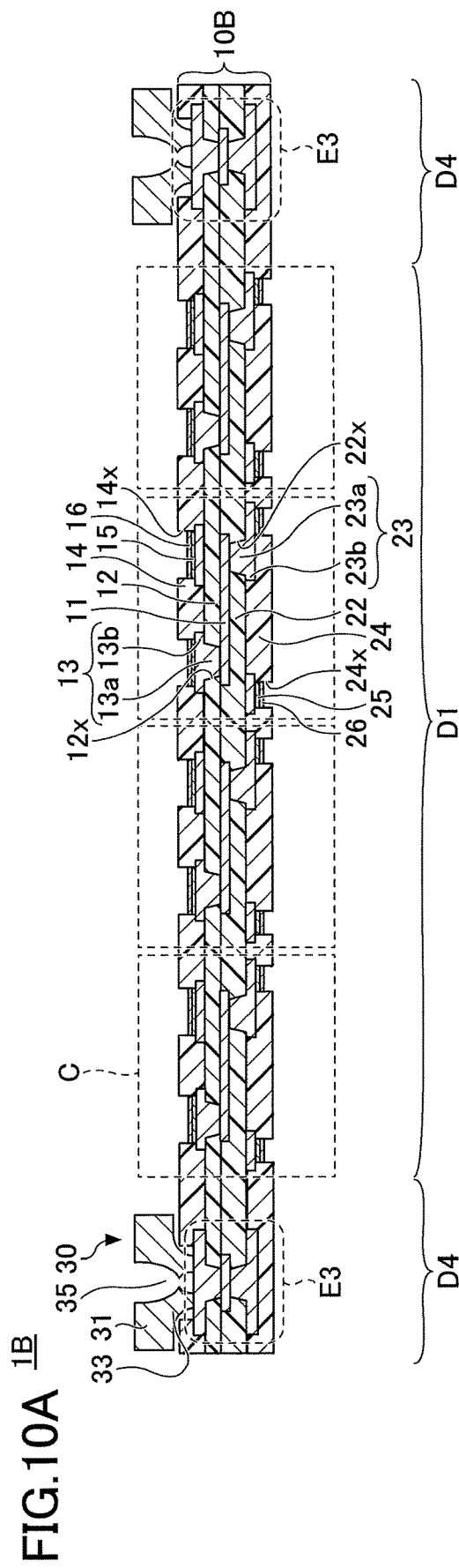
FIGS. 10A and 10B are diagrams illustrating an example of a substrate-with-support according to variation example 2 of the first embodiment.
Figure 10B:
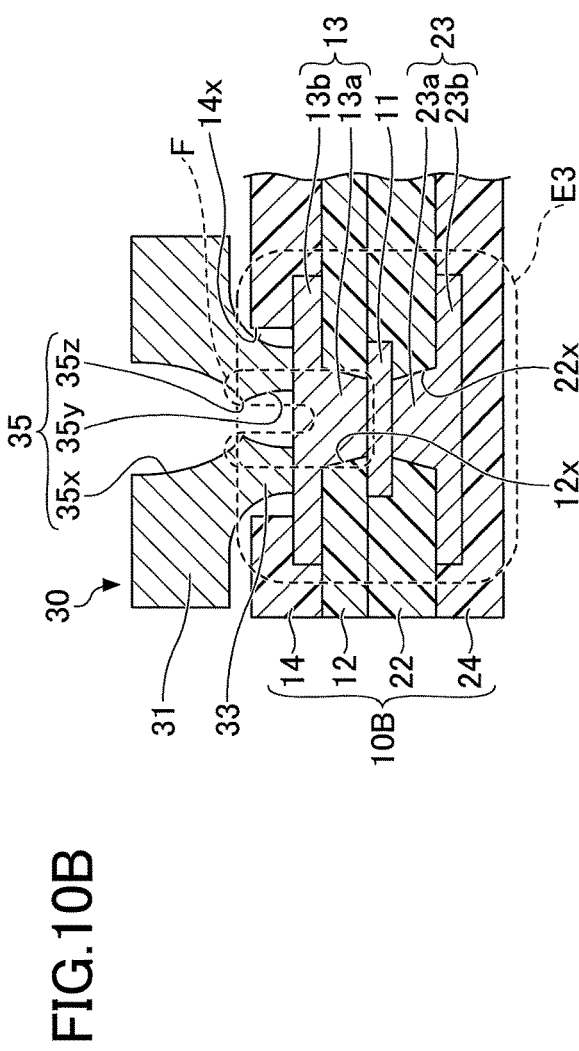

FIGS. 10A and 10B are diagrams illustrating an example of a substrate-with-support 1B according to variation example 2 of the first embodiment. FIG. 10A is a cross-sectional view of the substrate-with-support 1B corresponding to FIG. 2A, and FIG. 10B is a partially enlarged cross-sectional view in the vicinity of the outer peripheral area D4 of FIG. 10A.

With reference to FIGS. 10A and 10B, the substrate-with-support 1B differs from the substrate-with-support 1 (refer to FIG. 2 and the like) in that the substrate 10 having the support joint portions E1 are replaced with a substrate 10B having support joint portions E3. The support joint portions E3 of the substrate 10B have no metal layers 15, 16, 25, and 26 unlike the support joint portions E1, and the upper surface of the wiring layer 13 is exposed in the opening portions 14x of the solder resist layer 14.

In the substrate-with-support 1B, the support 30 is joined to the wiring layer 13 exposed in the opening portions 14x of the solder resist layer 14 of the substrate 10B. Specifically, in the substrate-with-support 1B, the upper surface of the wiring layer 13 of the support joint portions E3 exposed in the opening portions 14x of the solder resist layer 14 is in contact with the tips of the protruding portions 33, such that the support joint portions E3 and the protruding portion 33 are joined to each other. The support joint portions E3 and the protruding portions 33 can be joined by, for example, welding.

To manufacture the substrate 10B, in the step of forming the metal layers 15, 16, 25, and 26 by a plating process or the like in the first wiring area D1 and the second wiring area D2, the lower surface of the wiring layer 23 and the upper surface of the wiring layer 13 of the support joint portions E3 may be masked.

In a case where the wiring layer 13 and the protruding portions 33 are formed of copper or a copper alloy, the wiring layer 13 and the protruding portions 33, which are made of the same type of metal, are directly in contact without the presence of metal layers 15 and 16 made of dissimilar metals between the wiring layer 13 and protruding portions 33. Therefore, when the wiring layer 13 and the protruding portions 33 are joined by welding, it is possible to join the support 30 to the substrate 10B with a further smaller irradiation power than in the first embodiment and variation example 1. Thereby, thermal damage of the substrate 10B can be suppressed.

Note that depending on the required specifications, metal layers 15, 16, 25, and 26 may not be formed for all of the first wiring area D1, the second wiring area D2, and the support joint portions E3.

Also, in variation example 1 of the first embodiment, it is possible to adopt the support joint portions E3, and to achieve effects similar to those described above.

Although the preferred embodiment and the variation examples have been described above in detail, the present invention is not limited to the embodiment and the variation examples described above, and various variations and substitutions may be made for the embodiment and the variation examples described above without departing from the scope of the present invention.

For example, although the substrate and the support are joined by welding in the example described in the first embodiment and variation examples 1 and 2, the joining method is not limited to this and the substrate and the support may be joined by a method other than welding. The substrate and the support can be joined using, for example, solder or an adhesive. In this case, the solder or adhesive in paste state may be poured into the through holes formed in the protruding portions of the support to be cured.

Various aspects of the subject-matter described herein may be set out non-exhaustively in the following numbered clauses:

1. A method of manufacturing a substrate-with-support, the method including:
preparing a substrate having a wiring area, an outer peripheral area provided on an outer peripheral side of the wiring area, and a plurality of support joint portions being provided on the outer peripheral area;
preparing, by half-etching from both sides of a metal plate, a support made of metal having an outer frame portion arranged to face the outer peripheral area and to expose the wiring area, and a plurality of protruding portions being provided on the outer frame portion; and joining the support joint portions and the protruding portions to each other.

2. The method of clause 1,
wherein the respective support joint portions are conductor portions,
wherein by the half-etching, through holes penetrating the outer frame portion and the protruding portions in a thickness direction are formed such that, in each of the through holes, a first hole and a second hole are in communication, the first hole is opened on an outer side of the outer frame portion and whose opening size decreases toward the protruding portion, the second hole is opened on a tip side of the protruding portion and whose opening size decreases toward the first hole, and a portion where the first hole and the second hole are in communication is a minimum opening portion, and
wherein, in the joining, laser light is emitted into the through holes to melt and integrate at least part of the protruding potions and the conductor portions to form welded portions.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A substrate-with-support comprising:
   a substrate having a wiring area, an outer peripheral area provided on an outer peripheral side of the wiring area, and a plurality of support joint portions being provided on the outer peripheral area; and
   a support made of metal having an outer frame portion arranged to face the outer peripheral area and to expose the wiring area, and a plurality of protruding portions being provided on the outer frame portion,
   wherein the support joint portions and the protruding portions are joined to each other, and
   wherein through holes penetrating the outer frame portion and the protruding portions in a thickness direction are provided.

2. The substrate-with-support according to claim 1,
   wherein the respective support joint portions are conductor portions having exposed portions provided in an insulating layer constituting the substrate and partially exposed from the insulating layer, and
   wherein the exposed portions are in contact with tips of the respective protruding portions such that the conductor portions and the protruding portions are joined to each other.

3. The substrate-with-support according to claim 2,
   wherein the substrate includes a plurality of stacked insulating layers, and
   wherein each of the conductor portions has a columnar structure across the plurality of insulating layers.

4. The substrate-with-support according to claim 3, wherein the columnar structure includes a plurality of via wirings formed in different insulating layers.

5. The substrate-with-support according to claim 2, wherein at least part of the protruding potions and the conductor portions are integrated to form welded portions.

6. The substrate-with-support according to claim 1,
   wherein, for each of the through holes, a minimum opening portion, whose opening is smallest within the through hole, is formed on the support joint portion side with respect to a center in the thickness direction of an inner wall of the through hole.

7. The substrate-with-support according to claim 6,
   wherein each of the through holes is formed such that a first hole and a second hole are in communication, in which the first hole is opened on an outer side of the outer frame portion and whose opening size decreases toward the protruding portion, and the second hole is opened on a tip side of the protruding portion and whose opening size decreases toward the first hole, and
   wherein in each of the through holes, a portion where the first hole and the second hole are in communication is the minimum opening portion.

8. The substrate-with-support according to claim 1,
   wherein the substrate includes a separating area that separates a portion surrounded by the outer peripheral area into a plurality of wiring areas; and the plurality of wiring areas sectioned by the outer peripheral area and the separating area, the support joint portions being provided on the outer peripheral area and the separating area,
   wherein the support includes a bridge portion formed integrally with the outer frame portion and arranged to face the separating area, the protruding portions being provided on a side of the outer frame portion facing the outer peripheral area and on a side of the bridge portion facing the separating area,
   wherein the support joint portions, provided on the outer peripheral area, and the protruding portions, provided on the outer frame portion, are joined to each other, and
   wherein the support joint portions, provided on the separating area, and the protruding portions, provided on the bridge portion, are joined to each other.

* * * * *